United States Patent [19]
Cho

[11] Patent Number: 5,998,839
[45] Date of Patent: Dec. 7, 1999

[54] BOTTOM-GATED CYLINDRICAL-SHAPED THIN FILM TRANSISTOR HAVING A PERIPHERAL OFFSET SPACER

[75] Inventor: Seok Won Cho, Chungcheongbuk-do, Rep. of Korea

[73] Assignee: LG Semicon Co., Ltd., Cheongju, Rep. of Korea

[21] Appl. No.: 09/199,161

[22] Filed: Nov. 25, 1998

[30] Foreign Application Priority Data

Jan. 26, 1998 [KR] Rep. of Korea ......................... 98/2331

[51] Int. Cl.[6] ................................................. H01L 27/12
[52] U.S. Cl. ........................ 257/347; 257/900; 438/158; 438/595
[58] Field of Search ............................. 257/72, 900, 347; 438/158, 159, 303, 595

[56] References Cited

U.S. PATENT DOCUMENTS

| | | | |
|---|---|---|---|
| 5,001,540 | 3/1991 | Ishihara | 257/67 |
| 5,233,207 | 8/1993 | Anzai | 257/66 |
| 5,241,193 | 8/1993 | Pfiester et al. | 257/67 |
| 5,262,655 | 11/1993 | Ashida | 257/66 |
| 5,283,455 | 2/1994 | Inoue et al. | 257/329 |
| 5,393,992 | 2/1995 | Suzuki | 257/69 |
| 5,547,883 | 8/1996 | Kim | 437/40 |
| 5,563,077 | 10/1996 | Ha | 437/21 |
| 5,578,838 | 11/1996 | Cho et al. | 257/66 |
| 5,658,807 | 8/1997 | Manning | 438/158 |
| 5,659,183 | 8/1997 | Manning et al. | 257/66 |
| 5,723,879 | 3/1998 | Cho et al. | 257/60 |
| 5,780,911 | 7/1998 | Park et al. | 257/401 |

*Primary Examiner*—David B. Hardy
*Attorney, Agent, or Firm*—Fleshner & Kim

[57] ABSTRACT

A thin film transistor and a method for fabricating the same are disclosed, in which an offset region is affected or biased by a gate voltage to increase on-current, thereby improving on/off characteristic of a device. A first semiconductor layer is formed on a substrate, and insulating layer patterns are formed at both ends of the first semiconductor layer. A second semiconductor layer is formed on the first semiconductor layer and the insulating layer patterns. A gate insulating film is formed on the first and second semiconductor layers and the insulating layer patterns, and an active layer formed on the gate insulating film.

19 Claims, 8 Drawing Sheets

BOTTOM-GATED CYLINDRICAL-SHAPED THIN FILM TRANSISTOR HAVING A PERIPHERAL OFFSET SPACER

BACKGROUND OF THE INVENTION

1. Field of the Invention

The present invention relates to a semiconductor device, and more particularly, a thin film transistor and a method for fabricating the same.

2. Background of the Related Art

Generally, a thin film transistor is used as a CMOS load transistor or a load transistor in an SRAM cell of 4M or 16M. The thin film transistor is also used as a switching device for switching a picture data signal in each pixel region in a liquid crystal display device.

Particularly, an off-current should be reduced and an on-current should increase when a PMOS thin film transistor is used as the load transistor in the SRAM cell. For this reason, power consumption of the SRAM cell may be reduced and its memory characteristic is increased, thereby obtaining the SRAM cell of high quality.

FIG. 1 is a sectional view of a thin film transistor of the background art. The thin film transistor includes an insulating layer 21, a gate electrode 22a formed on the insulating layer 21, and a gate insulating film 24 formed on the insulating layer 21 including the gate electrode 22a. A drain electrode D is formed on the gate insulating film 24 at a predetermined distance from the gate electrode 22a, and a source electrode S is formed on the gate insulating film 24 to overlap the gate electrode 22a and spaced apart from the drain electrode D. A channel region I and an offset region II are formed on the gate insulating film 24 between the source electrode S and the drain electrode D. The offset region II is formed between the drain electrode D and the gate electrode 22a.

The method for fabricating the thin film transistor will be described with reference to FIGS. 2A to 2D. As shown in FIG. 2A, a first polysilicon layer 22 for a gate electrode of a bulk transistor is formed on the insulating layer or substrate 21. A photoresist is deposited on the first polysilicon layer 22 and then a mask pattern 23 is formed by exposure and development processes. Subsequently, the first polysilicon layer 22 is selectively removed by an etching process using the mask pattern 23 to form a gate electrode 22a, as shown in FIG. 2B.

As shown in FIG. 2C, a gate insulating film 24 is deposited on the insulating layer 21 including the gate electrode 22a. A second polysilicon layer 25 is then formed on the gate insulating film 24, which will be used to form the source and drain electrodes, an offset region and a channel region in the thin film transistor. Subsequently, a photoresist 26 is deposited on the second polysilicon layer 25 and then patterned by exposure and development processes.

As shown in FIG. 2D, a channel region and an offset region are defined by a photoresist pattern 26a of the patterned photoresist 26. Source and drain impurity ions or dopants are then implanted into the exposed second polysilicon layer 25 using the photoresist pattern 26a as a mask. Thus, a source electrode S is formed to partially overlap the gate electrode 22a and a drain electrode D is formed at a predetermined distance from the gate electrode 22a. The channel region I and the offset region II are formed between the source electrode S and the drain electrode D.

The above method for fabricating the thin film transistor has a problem that the on-current is small because the offset region is not affected by the gate voltage during the PMOS thin film transistor operation, thereby deteriorating reliability of the device.

SUMMARY OF THE INVENTION

An object of the present invention is to obviate at least the problems and disadvantages of the related art.

Another object of the present invention is to reduce the off current.

A further object of the present invention is to increase the on-current.

Still another object of the present invention is to provide a thin film transistor and a method for fabricating the same, in which an offset region is biased by a gate voltage to increase on-current, thereby improving on/off characteristic of a device.

To achieve these and other advantages and in accordance with the purpose of the present invention, as embodied and broadly described, a thin film transistor according to the present invention includes a first semiconductor layer formed on a substrate, insulating layer patterns formed at both ends of the first semiconductor layer, a second semiconductor layer formed on the first semiconductor layer and the insulating layer patterns, a gate insulating film formed on the first and second semiconductor layers and the insulating layer patterns, and an active layer formed on the gate insulating film.

In another aspect, a method for fabricating the thin film transistor according to the present invention includes the steps of forming a first semiconductor layer on a substrate, forming insulating layer patterns on both ends of the first semiconductor layer, forming a second semiconductor layer on the first semiconductor layer and the insulating layer patterns, forming a gate insulating film on the first and second semiconductor layers and the insulating layer patterns, and forming an active layer on the gate insulating film.

The present invention can be achieved in parts or a whole by a semiconductor device, comprising: a first conductive layer formed on a substrate; an offset spacer formed on the first conductor; a second conductive layer formed on the first conductive layer and the offset spacer; a first insulation layer formed over the substrate, the first and second conductive layers and the offset spacer; and an active layer formed on the first insulation layer, the active layer including source and drain electrodes, and channel and offset regions formed between the source and drain electrodes, the offset region being defined by the offset spacer.

The present invention can be also achieved in a whole or in parts by a semiconductor device, comprising: a first gate electrode formed on a substrate and having a first prescribed shape; a second gate electrode formed on the first gate electrode and having a second prescribed shape; an offset spacer formed in peripheral side surfaces of the second gate electrode and on the first gate electrode, the offset spacer having a height lower than the second gate electrode; an insulation film formed over the substrate, first and second gate electrodes and the offset spacer; and an active layer formed on the insulation film, the active layer including source and drain electrodes, and channel and offset regions formed between the source and drain electrodes, the offset region being defined by the offset spacer.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
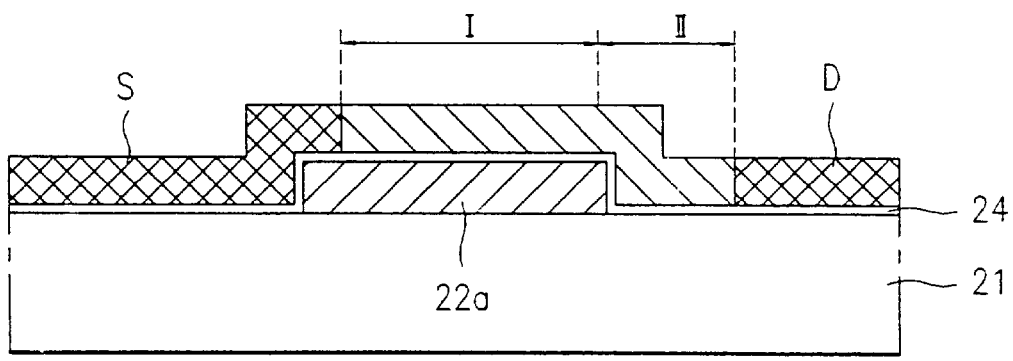
FIG. 1 is a sectional view illustrating a background art thin film transistor.
Figure 2A:
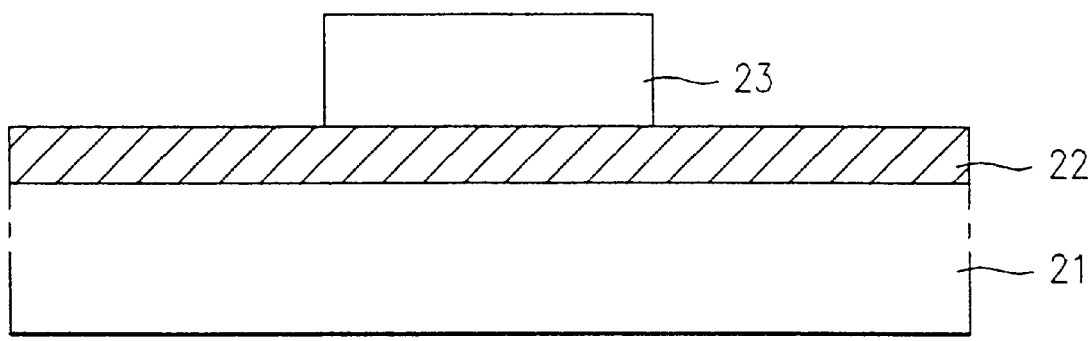
FIGS. 2A to 2D are sectional views of the process steps illustrating a method for fabricating a thin film transistor of FIG. 1.
Figure 2B:
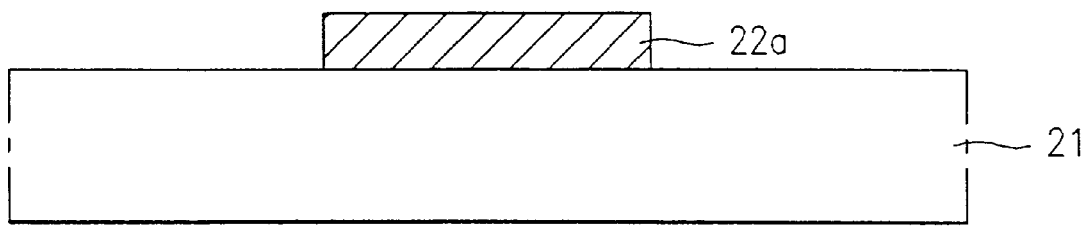
Figure 2C:
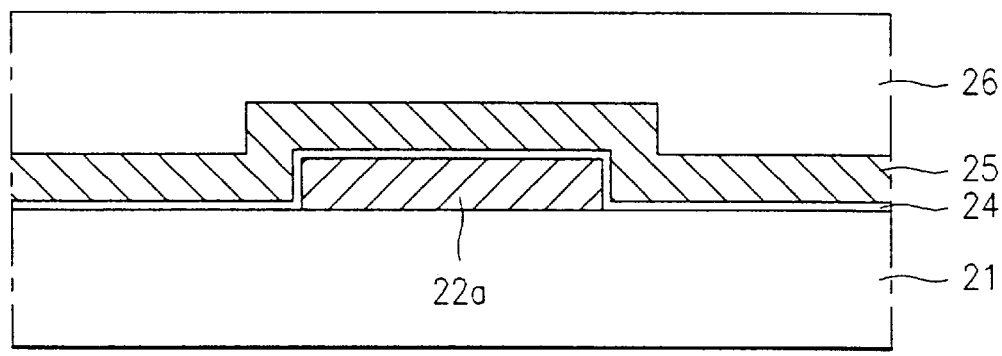
Figure 2D:
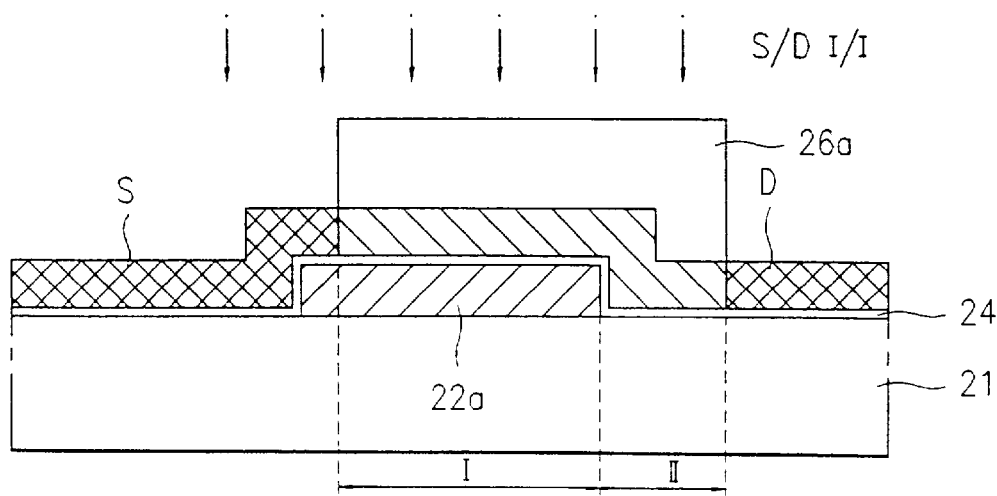
Figure 3:
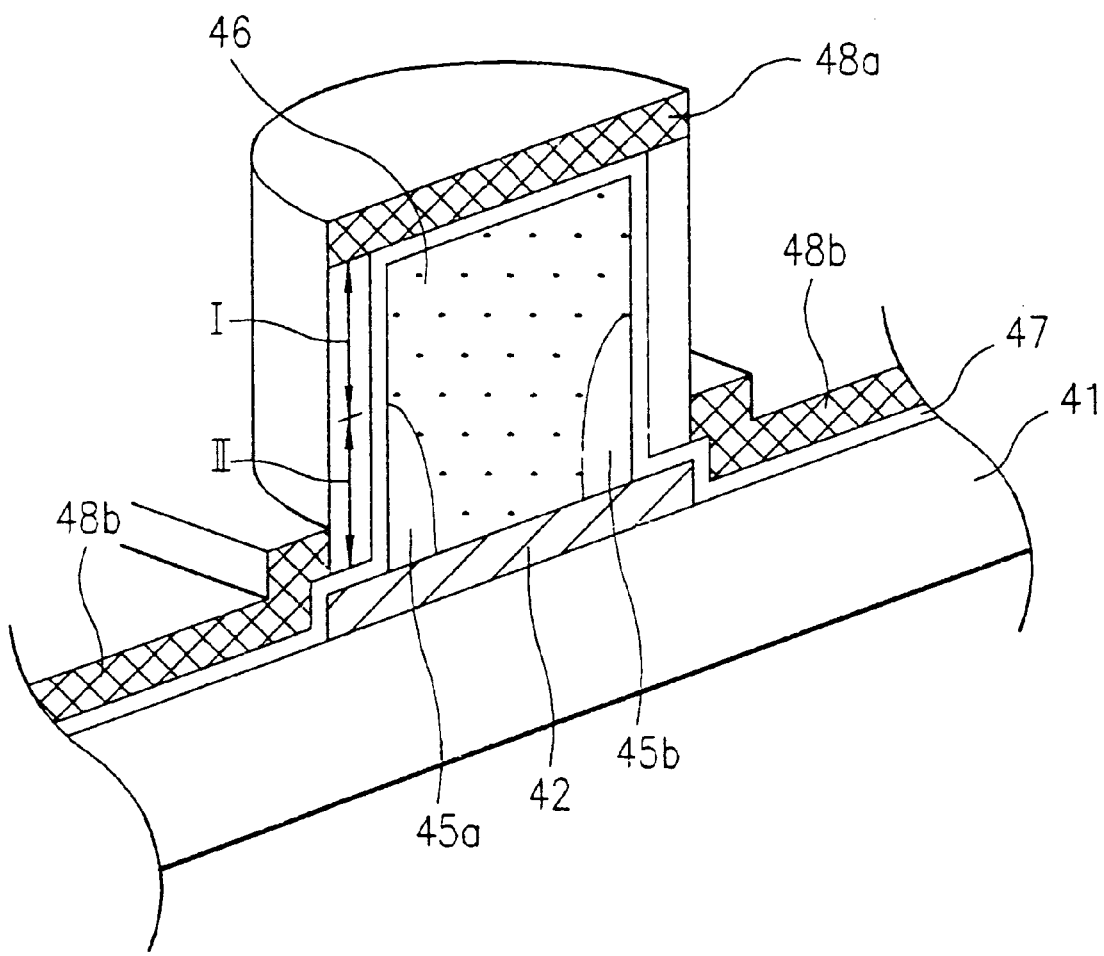
FIG. 3 is a perspective sectional view illustrating a thin film transistor according to a preferred embodiment of the present invention.

FIG. 3 is a cross-sectional illustration of a thin film transistor in accordance with a preferred embodiment of the present invention. A first semiconductor layer 42 is formed on a substrate 41, and a column or cylindrical shaped second semiconductor layer 46 formed on the first semiconductor layer 42, which has a concave shape in its lower portion serve as a gate electrode. Insulating layer patterns 45a and 45b are formed on a concave portion in the lower portion of the second semiconductor layer 46. A gate insulating film 47 is formed on an entire surface of the substrate 41 including the insulating patterns 45a and 45b, the second semiconductor layer 46 and the first semiconductor layer 42. An active layer 48 is formed on the gate insulating film 47, which includes source and drain electrodes 48a and 48b, a channel region I, and an offset region II.

The insulating layer patterns 45a and 45b are formed to surround the lower portion of the column shaped second semiconductor layer 46. The first and second semiconductor layer 46 are used as a gate electrode. The source electrode 48a is formed in the active layer 48 at an upper portion of the second semiconductor layer 46. The drain electrode 48b is formed in the active layer 48 at both sides of the first semiconductor layer 42. The offset region II is formed in the active layer 48 corresponding to any one of the insulating layer patterns 45a and 45b. The channel region I is formed in the active layer 48 between the offset region II and the source electrode 48a.

Figure 4A:
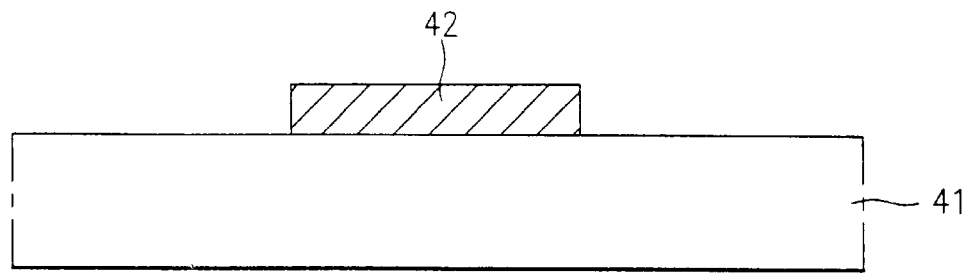
FIGS. 4A to 4G are sectional views of the process steps illustrating a method for fabricating a thin film transistor of FIG. 3.

A method for fabricating the thin film transistor according to the preferred embodiment of the present invention will be described with reference to FIGS. 4A to 4G. As shown in FIG. 4A, a first semiconductor layer 42 is formed in a predetermined portion on a substrate 41. The first semiconductor layer 42 is a polysilicon layer doped with a p type impurity ion. The first semiconductor layer 42 is patterned by photolithography. The substrate 41 is formed of an insulating material. Alternatively, a substrate in which an insulating layer is formed on a semiconductor substrate is used as the substrate 41.

Figure 4B:
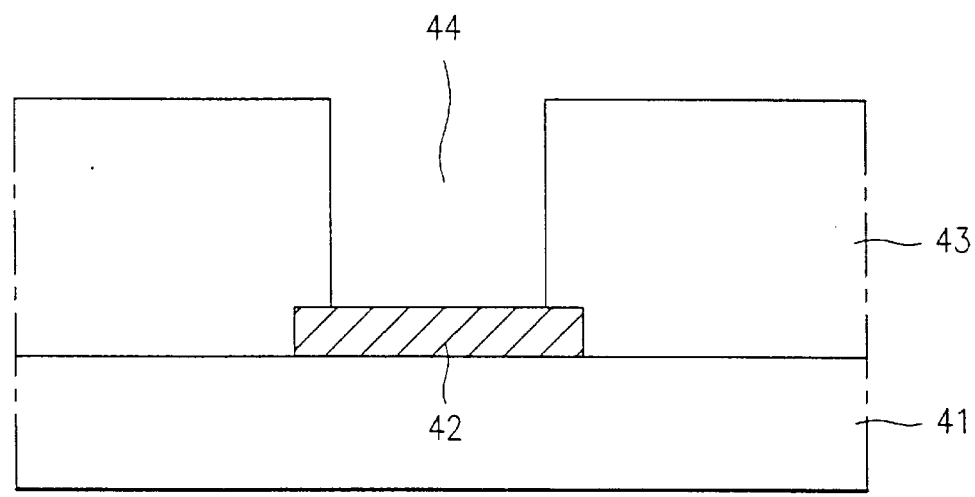

As shown in FIG. 4B, a first insulating layer 43 is formed on the substrate 41 including the first semiconductor layer 42. The first insulating layer 43 is selectively removed to partially expose a top surface of the first semiconductor layer 42, so that a contact hole 44 is formed.

Figure 4C:
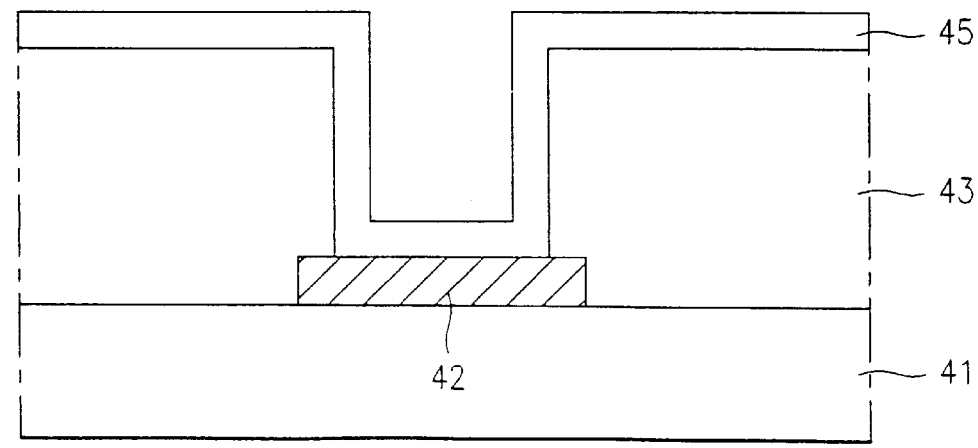
Figure 4D:
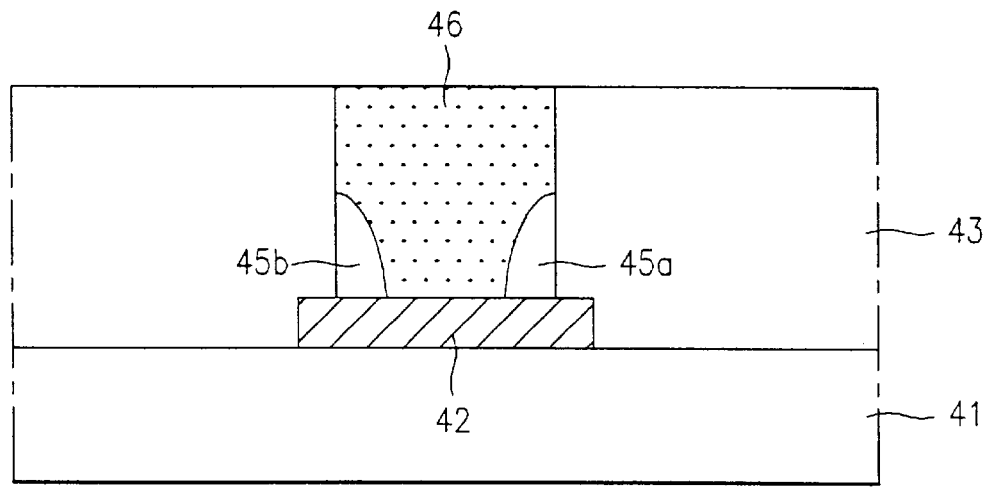

Subsequently, as shown in FIG. 4C, a second insulating layer 45 is formed on the first insulating layer 43 including the contact hole 44. The second insulating layer 45 is then etched back to form insulating layer patterns 45a and 45b at sides of the first insulating layer 43 in the contact hole 44, as shown in FIG. 4D. The first insulating layer 43 can be a silicon nitride layer, while the second insulating layer 45 can be a silicon oxide layer having etching selectivity different from that of the first insulating layer 43.

The insulating layer patterns 45a and 45b are not formed at the entire sides of the first insulating layer 43 in the contact hole 44 but formed with a predetermined height from the bottom at the sides of the first insulating layer 43. This is the reason why the second insulating layer 45 is overetched due to its etching selectivity being different from that of the first insulating layer 43.

The insulating layer patterns 45a and 45b may be formed on ends of the first semiconductor layer 42 or at a predetermined distance toward inner sides from ends of the first semiconductor layer 42. The insulating layer patterns 45a and 45b include sidewall spacers. Instead of the sidewall spacers, the process steps of forming insulating layers are applicable to the insulating layer patterns 45a and 45b.

Figure 5A:
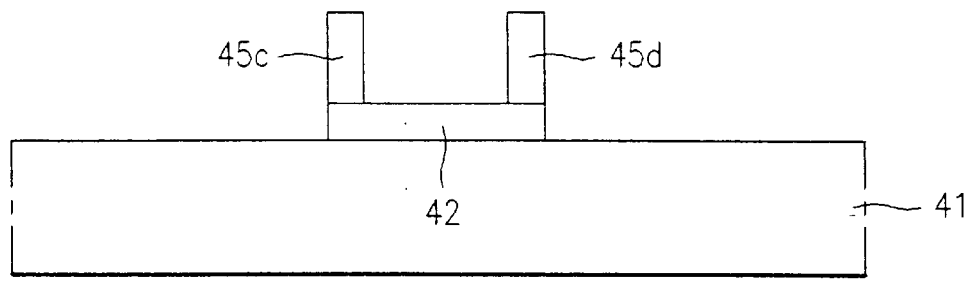
FIGS. 5A to 5C are sectional views illustrating the process steps of forming an insulating layer in accordance with another preferred embodiment of the present invention.

Alternative process steps of forming insulating layers will be described with reference to FIGS. 5A to 5C. As shown in FIG. 5A, an insulating layer is formed on the first semiconductor layer 42 and patterned by etching process to form insulating layers 45c and 45d on both ends of the first semiconductor layer 42.

Figure 5B:
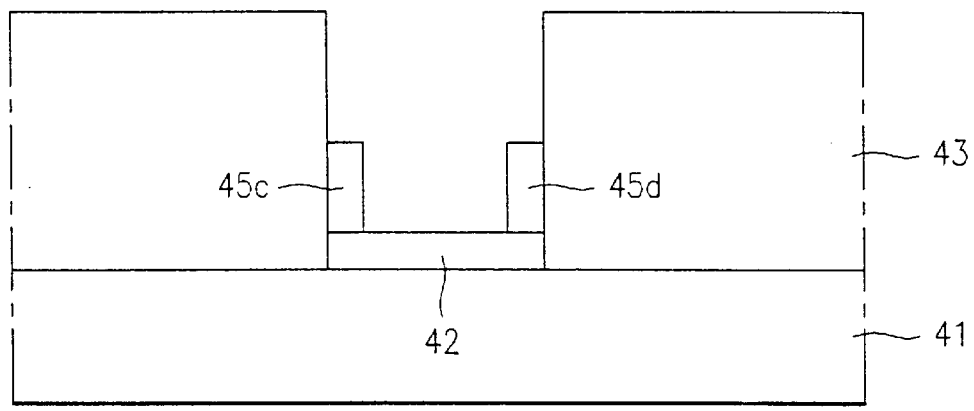

As shown in FIG. 5B, a first insulating layer 43 is formed on an entire surface including the insulating layers 45c and 45d. The first insulating layer 43 is selectively removed so as not to expose the substrate at both sides of the first semiconductor layer 42. Thus, a surface of the first semiconductor layer 42 is exposed.

Figure 5C:
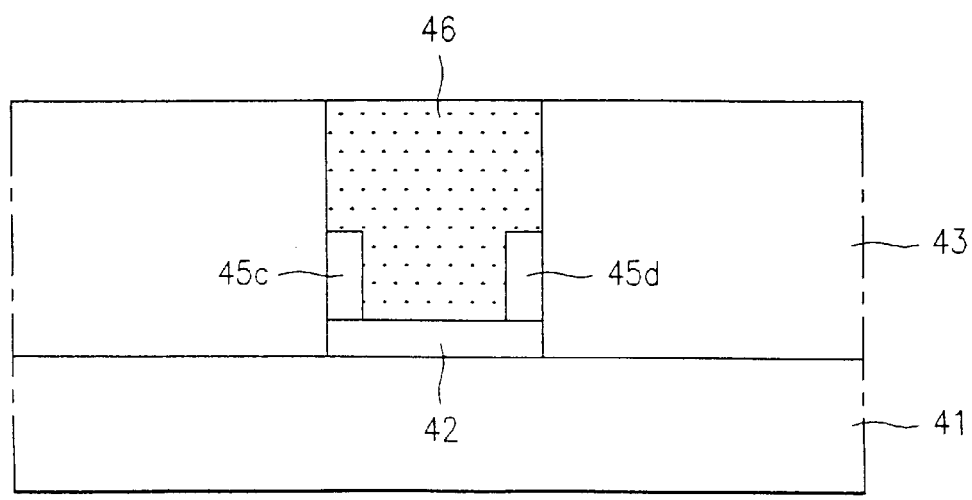

Subsequently, as shown in FIG. 5C, a second semiconductor layer 46 which is used as a gate electrode can be formed on the exposed insulating layers 45c and 45d including the exposed first semiconductor layer 42.

Meanwhile, in the first embodiment of the present invention, as shown in FIG. 4D, the semiconductor layer 46 is plugged in the contact hole 44 in which the insulating layer patterns 45a and 45b are formed. In other words, a polysilicon layer is formed on the first insulating layer 43 including the contact hole 44 and then selectively removed to remain only in the contact hole 44.

Figure 4E:
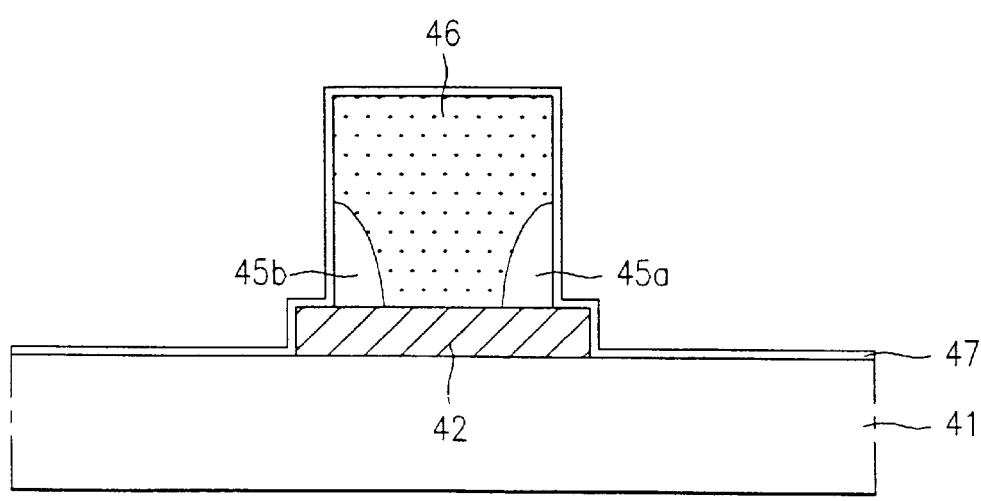

Subsequently, as shown in FIG. 4E, the first insulating layer 43 is removed except for the first semiconductor layer 42, the insulating layer patterns 45a and 45b and the semiconductor layer 46. A gate insulating film 47 is then deposited on the entire surface of the substrate 41 including the second semiconductor layer 46 and the first semiconductor layer 42.

Figure 4F:
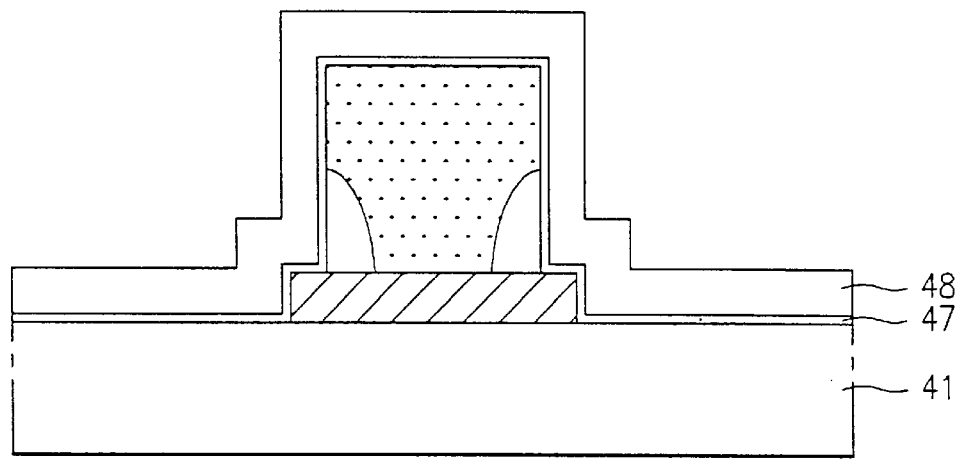

As shown in FIG. 4F, an active layer 48 is formed on the gate insulating film 47. The active layer 48 is a polysilicon layer which will include source and drain electrodes, a channel region and an offset region.

Figure 4G:
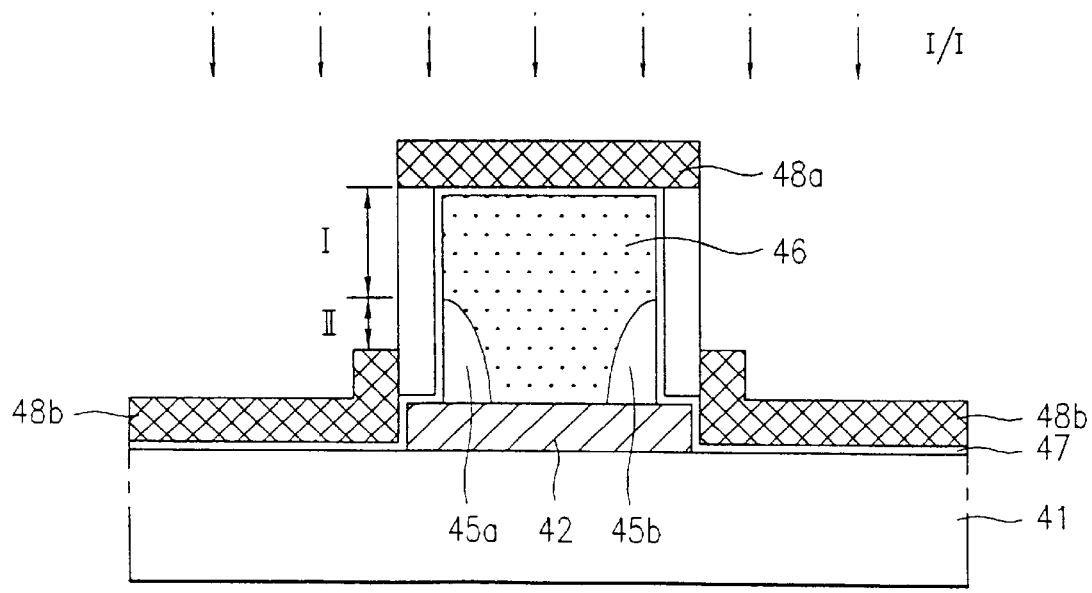

As shown in FIG. 4G, p conductivity type impurity ions for source and drain are implanted into the active layer 48. The active layer 48 over the second semiconductor layer 46 becomes a source electrode 48a and the active layer 48 at both sides of the first semiconductor layer 42 becomes a drain electrode 48b or vice versa.

The channel region I and the offset region II are formed between the source electrode 48a and the drain electrode 48b. The channel region I is formed in the active layer 48 corresponding to one side of the second semiconductor layer 46 except for the insulating layer patterns. The offset region II is formed between the channel region I and the drain electrode 48b.

At this time, since the second semiconductor layer 46 has a cylindrical shape, the channel region I is formed to surround an upper portion of the second semiconductor layer 46. The offset region II is defined by a height of any one of the insulating layer patterns 45a and 45b. In other words, the offset region II is defined by the factor as to how the second insulating layer is overetched to form the insulating layer patterns 45a and 45b.

As aforementioned, the thin film transistor and the method for fabricating the same according to the present invention have various advantages. Since the channel region is formed to surround the cylindrical shaped gate electrode, it is possible to increase the width of the channel region. Since the offset region is controlled by the gate voltage, it is possible to increase on-current, thereby improving on/off characteristic of the thin film transistor.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A semiconductor device, comprising:
   a first conductive layer formed on a substrate;
   an offset spacer formed on said first conductor;
   a second conductive layer formed on said first conductive layer and said offset spacer;
   a first insulation layer formed over the substrate, said first and second conductive layers and said offset spacer; and
   an active layer formed on said first insulation layer, the active layer including source and drain electrodes, and channel and offset regions formed between the source and drain electrodes, the offset region being defined by the offset spacer.

2. The semiconductor device of claim 1, wherein the offset spacer has one of a quarter-elliptical shape and a rectangular shape.

3. The semiconductor device of claim 1, wherein the substrate is made of one of an insulating substrate and an insulating material formed on a semiconductor substrate.

4. The semiconductor device of claim 1, wherein at least one of said active layer, said first conductive layer and said second conductive layer is made of a semiconductor material.

5. The semiconductor device of claim 4, wherein said active layer is a polysilicon layer and the source and drain electrodes are formed by doping the polysilicon layer with dopants.

6. The semiconductor device of claim 1, wherein said offset spacer is formed on a top surface of said first conductive layer and at a peripheral region of said first conductive layer.

7. The semiconductor device of claim 6, wherein a side of said offset spacer is flushed with a side of said first conductive layer.

8. The semiconductor device of claim 6, wherein a side of said offset spacer and a side of said first conductive layer are separated by a prescribed distance.

9. The semiconductor device of claim 8, wherein the side of said first conductive layer protrude beyond the said of said offset spacer such that the offset region overlaps the peripheral region of said first conductive layer.

10. A semiconductor device, comprising:
    a first gate electrode formed on a substrate and having a first prescribed shape;
    a second gate electrode formed on said first gate electrode and having a second prescribed shape;
    an offset spacer formed in peripheral side surfaces of said second gate electrode and on said first gate electrode, said offset spacer having a height lower than said second gate electrode;
    an insulation film formed over the substrate, first and second gate electrodes and said offset spacer; and
    an active layer formed on said insulation film, the active layer including source and drain electrodes, and channel and offset regions formed between the source and drain electrodes, the offset region being defined by the offset spacer.

11. The semiconductor device of claim 10, wherein said offset spacer has one of a quarter-elliptical shape and a rectangular shape.

12. The semiconductor device of claim 10, wherein the substrate is made of one of an insulating substrate and an insulating material formed on a semiconductor substrate.

13. The semiconductor device of claim 10, wherein at least one of said active layer, said first gate electrode and said second gate electrode is made of a semiconductor material.

14. The semiconductor device of claim 13, wherein said active layer is a polysilicon layer and the source and drain electrodes are formed by doping the polysilicon layer with dopants.

15. The semiconductor device of claim 10, wherein said offset spacer is formed on a top surface of said first gate electrode and at a peripheral region of said first gate electrode.

16. The semiconductor device of claim 15, wherein a side of said offset spacer is flushed with a side of said first gate electrode.

17. The semiconductor device of claim 15, wherein a side of said offset spacer and a side of said first gate electrode are separated by a prescribed distance.

18. The semiconductor device of claim 17, wherein the side of said first conductive layer protrude beyond the said of said offset spacer such that the offset region overlaps the peripheral region of said first conductive layer.

19. The semiconductor device of claim 10, wherein said first prescribed shape is rectangular and said second prescribed shape is cylindrical.

* * * * *